(12) United States Patent
Amthor et al.

(10) Patent No.: US 10,788,556 B2
(45) Date of Patent: Sep. 29, 2020

(54) STEADY STATE MAGNETIC RESONANCE FINGERPRINTING

(71) Applicant: KONINKLIJKE PHILIPS N.V., Eindhoven (NL)

(72) Inventors: Thomas Erik Amthor, Hamburg (DE); Peter Koken, Hamburg (DE); Karsten Sommer, Hamburg (DE); Mariya Ivanova Doneva, Hamburg (DE); Peter Boernert, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 140 days.

(21) Appl. No.: 16/072,940

(22) PCT Filed: Feb. 6, 2017

(86) PCT No.: PCT/EP2017/052481
§ 371 (c)(1),
(2) Date: Jul. 26, 2018

(87) PCT Pub. No.: WO2017/137333
PCT Pub. Date: Aug. 17, 2017

(65) Prior Publication Data
US 2019/0033413 A1     Jan. 31, 2019

(30) Foreign Application Priority Data
Feb. 9, 2016  (EP) .................................. 16154766

(51) Int. Cl.
*G01R 33/56* (2006.01)
*G01R 33/46* (2006.01)
(Continued)

(52) U.S. Cl.
CPC ..... *G01R 33/5608* (2013.01); *G01R 33/4625* (2013.01); *G01R 33/482* (2013.01);
(Continued)

(58) Field of Classification Search
CPC ................ G01R 33/5608; G01R 33/54; G01R 33/5613; G01R 33/5611; G01R 33/4828;
(Continued)

(56) References Cited

U.S. PATENT DOCUMENTS 8,384,380 B2 * 2/2013 Abe ........................ A61B 5/055
324/307
2008/0054899 A1 * 3/2008 Aksoy ................ G01R 33/5611
324/307
(Continued)

FOREIGN PATENT DOCUMENTS

WO     2015138941 A1    9/2015
WO     2015175028 A1    11/2015

OTHER PUBLICATIONS

Abdeen, Nishard, et al. "Measurement of xenon diffusing capacity in the rat lung by hyperpolarized 129Xe MRI and dynamic spectroscopy in a single breath-hold." Magnetic Resonance in Medicine: An Official Journal of the International Society for Magnetic Resonance in Medicine 56.2 (2006): 255-264. (Year: 2006).*
(Continued)

*Primary Examiner* — Christopher P McAndrew (57) ABSTRACT

A magnetic resonance imaging system (100) acquires magnetic resonance data (142) from a subject (118) within a measurement zone (108). Pulse sequence commands (140) control the magnetic resonance imaging system to acquire the magnetic resonance data according to a magnetic resonance fingerprinting protocol. The pulse sequence commands are configured for controlling the magnetic resonance imaging system to repeatedly generate an RF pulse train (300) and acquire the magnetic resonance data as multiple k-space traces. The machine executable instructions causes the processor to: sequentially acquire (200) the multiple k-space traces of magnetic resonance data by controlling the magnetic resonance imaging system with pulse sequence
(Continued)

commands and calculate (202) the abundance of each of a set of predetermined substances for k-space traces that are acquired after a predetermined number of k-space traces of the multiple k-space traces has been acquired and the acquired magnetization has reached a steady state. The abundance of each of a set of predetermined substances is determined by comparing the magnetic resonance data with a steady state magnetic resonance fingerprinting dictionary (144) which contains a listing of calculated magnetic resonance signals in response to the RF pulse train for a set of predetermined substances.

16 Claims, 4 Drawing Sheets

(51) Int. Cl.
    *G01R 33/48* (2006.01)
    *G01R 33/54* (2006.01)
    *G01R 33/561* (2006.01)
(52) U.S. Cl.
    CPC ..... *G01R 33/4824* (2013.01); *G01R 33/4828* (2013.01); *G01R 33/54* (2013.01); *G01R 33/5611* (2013.01); *G01R 33/5613* (2013.01); *G01R 33/4818* (2013.01)
(58) Field of Classification Search
    CPC .............. G01R 33/4824; G01R 33/482; G01R 33/4625; G01R 33/4818
    USPC ........................................................ 324/309
    See application file for complete search history.

(56) References Cited

U.S. PATENT DOCUMENTS

| | | | | |
|---|---|---|---|---|
| 2010/0156418 | A1* | 6/2010 | Abe | G01R 33/4835 324/310 |
| 2013/0147478 | A1* | 6/2013 | Zhou | G01R 33/44 324/309 |
| 2013/0265047 | A1 | 10/2013 | Griswold et al. | |
| 2013/0271132 | A1 | 10/2013 | Griswold et al. | |
| 2014/0167754 | A1* | 6/2014 | Jerecic | G01R 33/56 324/309 |
| 2014/0218027 | A1 | 8/2014 | Fautz | |
| 2014/0292325 | A1 | 10/2014 | Heule et al. | |
| 2015/0301138 | A1 | 10/2015 | Griswold et al. | |
| 2015/0301147 | A1 | 10/2015 | Gulani et al. | |
| 2015/0346300 | A1* | 12/2015 | Setsompop | G01R 33/4828 324/309 |
| 2016/0116559 | A1 | 4/2016 | Cohen | |
| 2016/0349339 | A1 | 12/2016 | Brady-Kalnay | |
| 2017/0199258 | A1* | 7/2017 | Beck | G01R 33/4828 |

OTHER PUBLICATIONS

Lindquist, M.A., 2008. The statistical analysis of fMRi data. Statistical science, 23(4), pp. 439-464. (Year: 2008).*
Ma et al "Magnetic Resonance Fingerprinting" Nature, vol. 495, pp. 187-193 Mar. 13, 2013.
Teng-Yi Huang et al "Are True FISP Images T2/T1 Weighted" Magnetic Resonance in Med. vol. 48, No. 4, Sep. 26, 2002 p. 684-688.
Barkauskas et al "Truefisp Blade Imaging in the Steady State" International Soc. for Magnetic Reson. in Med. May 6, 2006 p. 3380.
Schmitt et al "Inversion Recovery True FISP: Quantification of T1, T2 and Spin Density" Magnetic Resonance in Med. vol. 51, No. 4, Apr. 1, 2004 p. 661-667.
Noam Ben-Eliezer et al "Rapid and Accurate T2 Mapping From Multi-Spin Echo Data Using Bloch-Simulation Based Reconstruction" Magnetic Reson. in Med. vol. 73, No. 2, Mar. 19, 2014.
Gomez Pedro et al "Learning a Spatiotemporal Dictionary for Magnetic Resonance Fingerprinting With Compressed Sensing" Jan. 8, 2016, Correct System Design, p. 112-119.
Y. Jiang et al., "MR Fingerprinting Using Fast Imaging with Steady State . . . " Magn Reson. Med., doi: 10.1002/mrm.25559 (2014).
K. Scheffler, "A Pictorial Description of Steady-States in Rapid Magnetic Resonance Imaging" Concepts Magn. Reson. 11, 291 (1999).
D. Canet et al., "Communications Time Saving in C-Spin Lattice Relaxation Measurements by Inversion-Recover" J. Magn. Reson. 18, 199 (1975).

* cited by examiner

STEADY STATE MAGNETIC RESONANCE FINGERPRINTING

CROSS REFERENCE TO RELATED APPLICATIONS

This application is a U.S. national phase application of International Application No. PCT/EP2017/052481, filed on Feb. 6, 2017, which claims the benefit of EP Application Serial No. 16154766.6 filed on Feb. 9, 2016 and is incorporated herein by reference.

TECHNICAL FIELD OF THE INVENTION

The invention relates to magnetic resonance imaging, in particular to magnetic resonance fingerprinting.

BACKGROUND OF THE INVENTION

Magnetic Resonance fingerprinting (MRF) is a new technique where a number of RF pulses, distributed in time, are applied such that they cause signals from different materials or tissues to have a unique contribution to the measured Magnetic Resonance (MR) signal. A limited dictionary of precalculated signal contributions from a set or fixed number of substances is compared to the measured MR signals and within a single voxel the composition can be determined. For example if it is known that a voxel only contains water, fat, and muscle tissue the contribution from these three materials need only be considered and only a few RF pulses are needed to accurately determine the composition of the voxel.

The magnetic resonance fingerprinting technique was introduced in the journal article Ma et al., "Magnetic Resonance Fingerprinting," Nature, Vol. 495, pp. 187 to 193, doi:10.1038/Nature11971. The magnetic fingerprinting technique is also described in United States patent applications US 2013/0271132 A1 and US 2013/0265047 A1. The US_patetn application US2015/0346300 discloses a magnetic fingerprinting (MRF) method that is applied with simultaneous multi volume acquisition.

SUMMARY OF THE INVENTION

The invention provides for a magnetic resonance imaging system, a computer program product, and a method in the independent claims. Embodiments are given in the dependent claims.

The Nature article by Ma et al. introduces the basic idea of magnetic resonance fingerprinting and terminology which is used to describe this technique such as the dictionary, which is referred to herein as a "steady state magnetic resonance fingerprinting dictionary" or a "transient resonance fingerprinting dictionary." The term "dictionary" alone is understood to refer to a magnetic resonance fingerprinting dictionary.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from the subject within a measurement zone. The magnetic resonance imaging system comprises a processor for controlling the magnetic resonance imaging system. The magnetic resonance imaging system further comprises a memory for storing machine-executable instructions. The memory is for further storing pulse sequence commands. The pulse sequence commands are adapted for controlling the magnetic resonance imaging system to acquire the magnetic resonance data according to a magnetic resonance fingerprinting protocol. Pulse sequence commands as used herein comprise either instructions or data which may be converted into instructions or commands for controlling a magnetic resonance imaging system according to a resonance imaging protocol. The pulse sequence commands are configured for controlling the magnetic resonance imaging system to generate a radio-frequency pulse train. The pulse sequence commands are configured for controlling the magnetic resonance imaging system to acquire the magnetic resonance data as multiple k-space traces.

In magnetic resonance imaging the data is sampled in so called k-space. A k-space trace is a path through k-space that is sampled. When sampled in Cartesian space the k-space traces may refer to so called lines of k-space which are sampled. The pulse sequence commands are configured for controlling the radio-frequency pulse train to be repeated for the acquisition of each of the multiple k-space traces.

Execution of the machine-executable instructions causes the processor to sequentially acquire the multiple k-space traces of magnetic resonance data by controlling the magnetic resonance imaging system with the pulse sequence commands. Execution of the machine-executable instructions further cause the processor to calculate the abundance of each of a set of predetermined substances for k-space traces that are acquired after an initially acquired predetermined member of k-space traces of the multiple k-space traces have been acquired. The abundance of each of a set of predetermined substances is determined by comparing the magnetic resonance data with a steady state magnetic resonance fingerprinting dictionary. The steady state magnetic resonance fingerprinting dictionary contains a listing of the calculated magnetic resonance signals in response to the RF-pulse train for a set of predetermined substances.

In this embodiment the comparison of the k-space traces to the steady state magnetic resonance fingerprinting dictionary after an initially acquired predetermined number of k-space traces has been performed enables the acquisition of the multiple k-space traces to be performed more rapidly. After the RF-pulse train has been performed once there may be a residual magnetization in the bins within the measurement zone. After the predetermined number of k-space traces has been acquired the magnetization will eventually reach an equilibrium point. After this point the steady state magnetic resonance fingerprinting dictionary may be used. This for example may enable the magnetic resonance data to be acquired continuously. This may also enable more complicated magnetic resonance techniques to be implemented using magnetic resonance fingerprinting.

As an example, in parallel imaging techniques such as SENSE the RF-pulse train for magnetic resonance fingerprinting may be used. A difficulty with doing this is that residual magnetization may require a long delay before more data can be acquired. By using a steady state magnetic resonance fingerprinting dictionary that is used only after a certain number of RF-pulse trains have been performed enables the magnetic resonance data to be used to accurately calculate the abundance of the predetermined substances in the steady state magnetic resonance fingerprinting dictionary.

In another embodiment, execution of the machine-executable instructions causes the processor to discard the initially acquired predetermined number of k-space traces. For example, to put the spins into the steady state magnetization, the pulse sequence may be performed the predetermined number of times initially. This may have the technical effect that only a single magnetic resonance fingerprinting dictionary is needed and using this single magnetic resonance fingerprinting dictionary the acquisition of the magnetic resonance data may be accelerated. In one example the first predetermined number of acquisitions is discarded and after this is performed the real or actual data which is to be used is acquired.

In another embodiment, the pulse sequence instructions are configured for controlling the RF-pulse train to be repeated continuously. This may have the technical effect that the magnetic resonance data is acquired as rapidly as possible.

In another embodiment, the pulse sequence instructions are configured for controlling the magnetic resonance imaging system to repeat the RF-pulse train with a maximum delay between each RF-pulse train. The maximum delay is any one of the following: less than 5 seconds, less than 1 second, less than 0.5 seconds, less than 0.1 seconds, less than 0.05 seconds, and 0.00 seconds. This embodiment may have the technical effect of minimizing the delay between acquisitions.

In another embodiment, the magnetic resonance imaging system comprises a magnet with a main magnetic field. The main magnetic field is often referred to as the so called BO field. The main magnetic field has an average magnetic field magnitude within the measurement zone. Execution of the machine-executable instructions causes the processor to repeat each RF-pulse train faster than any one of the following: 5 times a maximum T1 time of the set of predetermined substances in the average magnetic field magnitude, 1 times a maximum T1 time of the set of predetermined substances in the average magnetic field magnitude, 0.5 times a maximum T1 time of the set of predetermined substances in the average magnetic field magnitude, and 0.1 times a maximum T1 time of the set of predetermined substances in the average magnetic field magnitude. Each of the set of predetermined substances in the steady state magnetic resonance fingerprinting dictionary will have a particular T1 relaxation time. The maximum T1 value of all of these substances is also dependent upon the average strength of the main magnetic field. Each of the times specified above enable the magnetic resonance data to be acquired more rapidly than if the steady state magnetic resonance fingerprinting dictionary is not used.

In another embodiment, execution of the machine-executable instructions further causes the processor to calculate the steady state magnetic resonance fingerprinting dictionary. The steady state magnetic resonance fingerprinting dictionary may be calculated using any one of the standard methods of calculating the steady state magnetic resonance fingerprinting dictionary. For example, the dictionary may be calculated by solving the Bloch equation or by performing an extended phase graph calculation.

The steady state magnetic resonance finger printing dictionary may be calculated, for example, by repeating the RF-pulse train the calculation converges to a steady state result. In magnetic resonance fingerprinting the dictionaries are calculated for a particular RF-pulse. The same technique can be used to calculate the steady state dictionary. The single RF-pulse is repeated multiple times and the same calculations are used to calculate the response of the spins. After the calculation has been repeated the predetermined number of times the response to the RF-pulse train reaches a steady state. The process of calculating the steady state magnetic resonance fingerprinting dictionary in this fashion may also be used to determine the predetermined number.

In another embodiment execution of the machine-executable instructions further cause the processor to calculate the steady state magnetic resonance fingerprinting dictionary by modeling each of the predetermined substances as a single spin with the Bloch equations for each of the discrete voxels. For example, in each of the discrete voxels a hypothetical spin can be modeled using the Bloch equations and a simulation of the magnetic resonance system using the pulse sequence instructions. The calculated magnetic resonance data at each of the sampling times is then the magnetic resonance fingerprinting dictionary for the particular type of spin that was modeled. This would function particularly well for the case where the measurement zone is only divided into a single voxel. It also applies to the case where there is no gradient magnetic field for spatial encoding. For example, the magnetic resonance system could be a so-called NMR system for doing a chemical analysis on a sample.

In another embodiment execution of the machine-executable instructions further causes the processor to calculate the steady state magnetic resonance fingerprinting dictionary by modeling repeated application of the RF-pulse train to each of the set of predetermined substances.

In another embodiment execution of the machine-executable instructions further causes the processor to determine the predetermined number during calculation of the steady state magnetic resonance fingerprinting dictionary. The predetermined number is determined using a convergence criteria to determine convergence of simulated magnetic resonance data generated during the calculation of the steady state magnetic resonance fingerprinting dictionary. The convergence criteria for instance might be a least squared routine or other algorithm which is used to measure the distance of multiple pieces of data and calculate a fitting.

In another embodiment, the pulse sequence commands are configured for controlling the magnetic resonance imaging system to perform any one of the following: rotate the multiple k-space traces in k-space, acquire the multiple k-space traces using radial sampling, acquire the multiple k-space traces using Cartesian sampling, and acquire the multiple k-space traces using non-Cartesian sampling.

In another embodiment the pulse sequence instructions are configured for controlling the magnetic resonance imaging system to acquire the magnetic resonance data according to a PROPELLER magnetic resonance imaging protocol. The PROPELLER magnetic resonance imaging protocols acquire the k-space lines or traces in space by rotating them. The use of a steady state magnetic resonance fingerprinting dictionary enables the magnetic resonance data to be acquired more rapidly and thereby reducing the effect of motion of the subject. The use of the PROPELLER magnetic resonance imaging protocol may also be used for correcting for motion of the subject. The combination of the two may lead to more rapidly acquired data that is less susceptible to motion of the subject when the magnetic resonance data is acquired.

In another embodiment, the pulse sequence instructions are configured for controlling the magnetic resonance imaging system to acquire the multiple k-space traces as spirals in k-space.

In another embodiment, the pulse sequence instructions are configured for controlling the magnetic resonance imaging system to acquire the multiple k-space traces as lines in Cartesian k-space.

In another embodiment, the pulse sequence instructions are configured for controlling the magnetic resonance imaging system to acquire the magnetic resonance data according to any one of the following: a parallel imaging magnetic resonance imaging protocol, a SENSE magnetic resonance imaging protocol, and a GRAPPA magnetic resonance imaging protocol.

In another embodiment the pulse sequence instructions are configured for controlling the magnetic resonance imaging system to acquire the magnetic resonance data according to a SENSE magnetic resonance imaging protocol.

In another aspect the invention provides for a computer program product comprising machine-executable instructions for execution by a processor controlling a magnetic resonance imaging system to acquire magnetic resonance data from a subject within a measurement zone. The executable instructions cause the processor to sequentially acquire multiple k-space traces of magnetic resonance data by controlling the magnetic resonance imaging system with pulse sequence commands for controlling the magnetic resonance imaging system to acquire the magnetic resonance data according to a magnetic resonance fingerprinting protocol. The pulse sequence commands are configured for controlling the magnetic resonance imaging system to generate an RF-pulse train. The pulse sequence commands are configured for controlling the magnetic resonance imaging system to acquire the magnetic resonance data as multiple k-space traces. The pulse sequence commands are configured for controlling the RF-pulse train to be repeated for the acquisition of each of the multiple k-space traces. Execution of the machine-executable instructions further cause the processor to calculate the abundance of each of the set of predetermined substances for k-space traces that are acquired after an initially acquired predetermined number of k-space traces of the multiple k-space traces has been acquired. The abundance of each of the set of predetermined substances is determined by comparing the magnetic resonance data with a steady state magnetic resonance fingerprinting dictionary. The steady state magnetic resonance fingerprinting dictionary contains a listing of calculated magnetic resonance signals in response to the RF-pulse train for a set of predetermined substances.

In another aspect the invention further provides for a method of operating the magnetic resonance imaging system for acquiring magnetic resonance data from a subject within a measurement zone. The method comprises sequentially acquiring the multiple k-space traces of magnetic resonance data by controlling the magnetic resonance imaging system with pulse sequence commands for controlling the magnetic resonance imaging system to acquire the magnetic resonance data according to a magnetic resonance fingerprinting protocol. The pulse sequence commands are further configured for controlling the magnetic resonance imaging system to generate an RF-pulse train. The pulse sequence commands are configured for controlling the magnetic resonance imaging system to acquire the magnetic resonance data as multiple k-space traces. The pulse sequence commands are configured for controlling the RF-pulse train to be repeated for the acquisition of each of the multiple k-space traces. The method further comprises calculating the abundance of each of the set of predetermined substances for k-space traces that are acquired after an initially acquired predetermined number of k-space traces of the multiple k-space traces has been acquired. The abundance of each of the set of predetermined substances is determined by comparing the magnetic resonance data with a steady state magnetic resonance fingerprinting dictionary. The steady state magnetic resonance fingerprinting dictionary contains a listing of calculated magnetic resonance signals in response to the RF-pulse train for a set of predetermined substances.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor.

'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
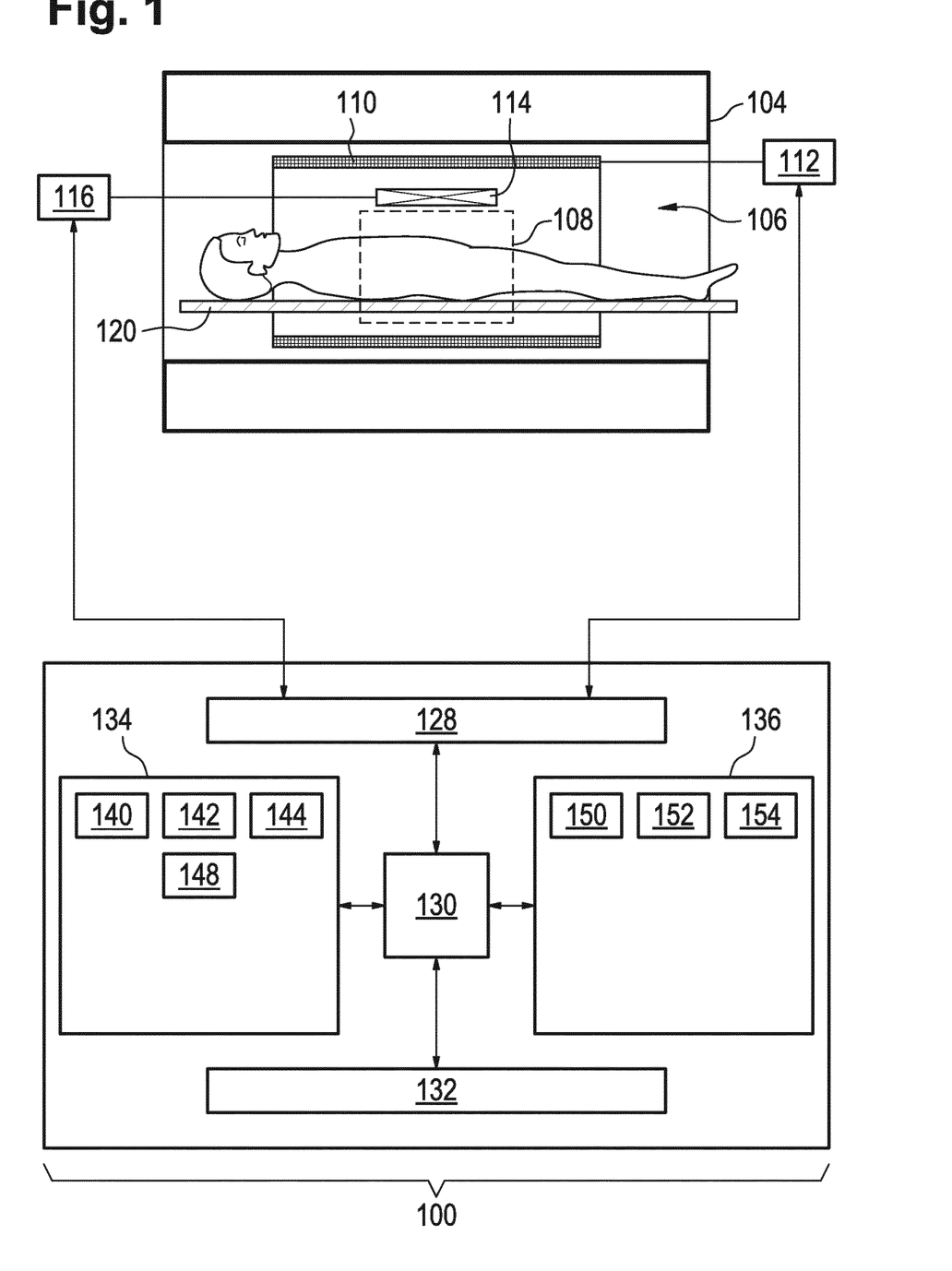
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the magnetic field gradient coil power supply 112 are all connected to a hardware interface 128 of computer system 126.

The computer storage 134 is shown as containing pulse sequence commands 140. The pulse sequence commands control the magnetic resonance imaging system 100 to acquire magnetic resonance data 142 according to a magnetic resonance fingerprinting protocol. The magnetic resonance data 142 is shown as being stored in the computer storage 134. The computer storage 134 is further shown as containing a steady state magnetic resonance fingerprinting dictionary 144. The computer storage 134 is also further shown as containing a magnetic resonance image 148 that was reconstructed from the magnetic resonance data 142 according to the magnetic resonance fingerprinting protocol. The magnetic resonance image 148 may for example be a two or three-dimensional map of the concentration of the various substances in the set of predetermined substances.

The computer memory 136 is shown as containing control instructions 150. The control instructions 150 contain instructions which enable the processor 130 to control the operation and function of the magnetic resonance imaging system 100. For example, the control instructions 150 may contain commands which enable the processor 130 to use the pulse sequence commands 140 to control the magnetic resonance imaging system. The computer memory 136 is further shown as containing a magnetic resonance fingerprinting dictionary generating instructions 152. The magnetic resonance fingerprinting dictionary generating instructions 152 are optional. They for instance may contain a model which is used to generate the steady state magnetic resonance fingerprinting dictionary 144. The computer memory 136 is further shown as containing image reconstruction instructions 154. The image reconstruction instructions 154 contain instructions which enable the processor 130 to reconstruct the magnetic resonance image 148 from the magnetic resonance data 142. For example the magnetic resonance image 148 may be a rendering of the spatial distribution of one or more of the predetermined substances within the subject 118.

The contents of the computer storage 134 and the computer memory 136 may duplicate each other or the contents of either may be exchanged.

The example of FIG. 1 could be modified so that the magnetic resonance imaging system or apparatus 100 is equivalent to a Nuclear Magnetic Resonance (NMR) spectometer. Without gradient coils 110 and the gradient coil power supply 112 the apparatus 100 would perform a 0-dimensional measurement in the imaging zone 108.

Figure 2:
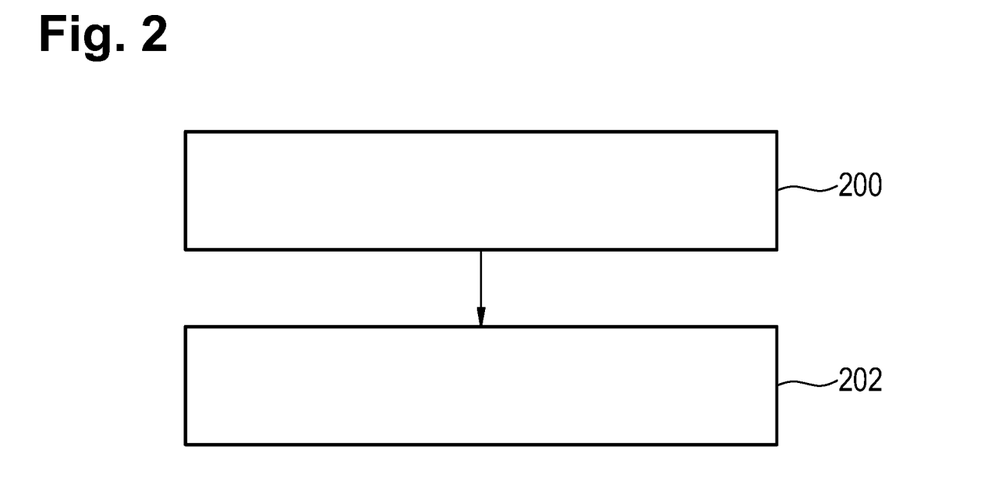
FIG. 2 shows a flow chart which illustrates a method of using the magnetic resonance imaging system of FIG. 1.

FIG. 2 shows a flowchart which illustrates an example of a method of operating the magnetic resonance imaging system 100 of FIG. 1. First in step 200 multiple k-space traces of magnetic resonance data 142 are sequentially acquired by controlling the magnetic resonance imaging system 100 with pulse sequence commands 140. The pulse sequence commands 140 control the magnetic resonance imaging system to acquire the magnetic resonance data according to a magnetic resonance fingerprinting protocol. The pulse sequence commands 140 are configured for controlling the magnetic resonance imaging system 100 to generate an RF-pulse train. The pulse sequence commands 140 are configured for controlling the magnetic resonance imaging system to acquire the magnetic resonance data 142 as multiple k-space traces. The pulse sequence commands 140 are configured for controlling the RF-pulse train to be repeated for the acquisition of each of the multiple k-space traces.

The method further comprises calculating 202 the abundance of each of the set of predetermined substances for k-space traces that are acquired after initially acquired predetermined number of k-space traces of the multiple k-space traces that have been acquired. The abundance of each of the set of predetermined substances is determined by comparing the magnetic resonance data with a steady state magnetic resonance fingerprinting dictionary 144. The steady state magnetic resonance fingerprinting dictionary 144 contains a listing of calculated magnetic resonance signals in response to the RF-pulse train for a set of predetermined substances. In some examples the initially acquired predetermined number of k-space traces is discarded.

Magnetic Resonance Fingerprinting (MRF) is a promising technique for quantitative multi-parametric measurements and tissue characterization. A train of RF pulses produces an MR signal that serves as a fingerprint for a certain tissue type. This fingerprint can later be compared with a dictionary of known signals.

Many previously reported approaches combine a long fingerprint sequence with a spiral sampling for fast acquisition. However, it can also be technically beneficial to shorten the MRF sequence and use Cartesian sampling in combination with SENSE for accelerated acquisition. In this case, the pulse train must be applied once for each trace in k-space to be sampled. The same is true for high-resolution radial or spiral sampling, where multiple k-space trajectories are measured subsequently. The present invention focuses on this case of sampling k-space in separate parts.

Sampling multiple traces or segments in k-space subsequently (as in Cartesian sampling techniques) in an interleaved fashion usually requires waiting for the spin system to relax between the fingerprint acquisitions, so that the typical acquisition time is very long.

This disadvantage may possibly be overcome in the following way: Instead of waiting for the spin system to relax completely, the delay is shortened and the time development of the spin system between the fingerprint sequences is taken into account in the calculation of the dictionary. We show that a stationary solution of the fingerprint signal can be found for this purpose.

In this way, Cartesian or otherwise densely sampled MRF scans can be accelerated significantly without compromising matching accuracy.

Examples may contain one or more of the following features:
An MR imaging system to acquire MR signals.
A program to acquire data according to a pseudo-random MR Fingerprint sequence.
A software to calculate an MRF dictionary based on a steady-state MRF signal as explained below.
A method to match the measured signals to the dictionary.
One way of calculating dictionary entries is as follows:
1. Compose a sequence that consists of a number of repetitions of the base MRF trains with inter-train delays $t_d$.
2. Calculate the expected signal for a set of tissue parameters for the complete composed sequence, taking the time development of the spin system during the delays into account. The type of calculation depends on the type of MR sequence used. It can be a Bloch simulation of a single spin, a Bloch simulation of a collection of spins, an Extended Phase Graph calculation, or any other spin model calculation that describes the system sufficiently well.
3. From the calculated signal, cut out the part that corresponds to the last fingerprint repetition and use this fingerprint signal as the dictionary entry.

The MRF measurement must then be performed using the same inter-train delay td as assumed in the calculation.

EXAMPLE

The magnetic resonance fingerprint sequence used in this example is based on a spoiled gradient-echo sequence. It consists of a train of 200 flip angles, preceded by an inversion pulse, with a total time of 3 seconds for the 200 steps. The sequence is repeated several times and the expected signal of the complete pulse train is calculated using an Extended Phase Graph formalism. Measurements have been performed using a phantom equipped with known gel samples. The MRF dictionary consists of 18 entries for the different samples (227 ms≤T1≤1646 ms; 48 ms≤T2≤369 ms), 12 of which are present in the phantom, and one entry for the background.

Figure 3:
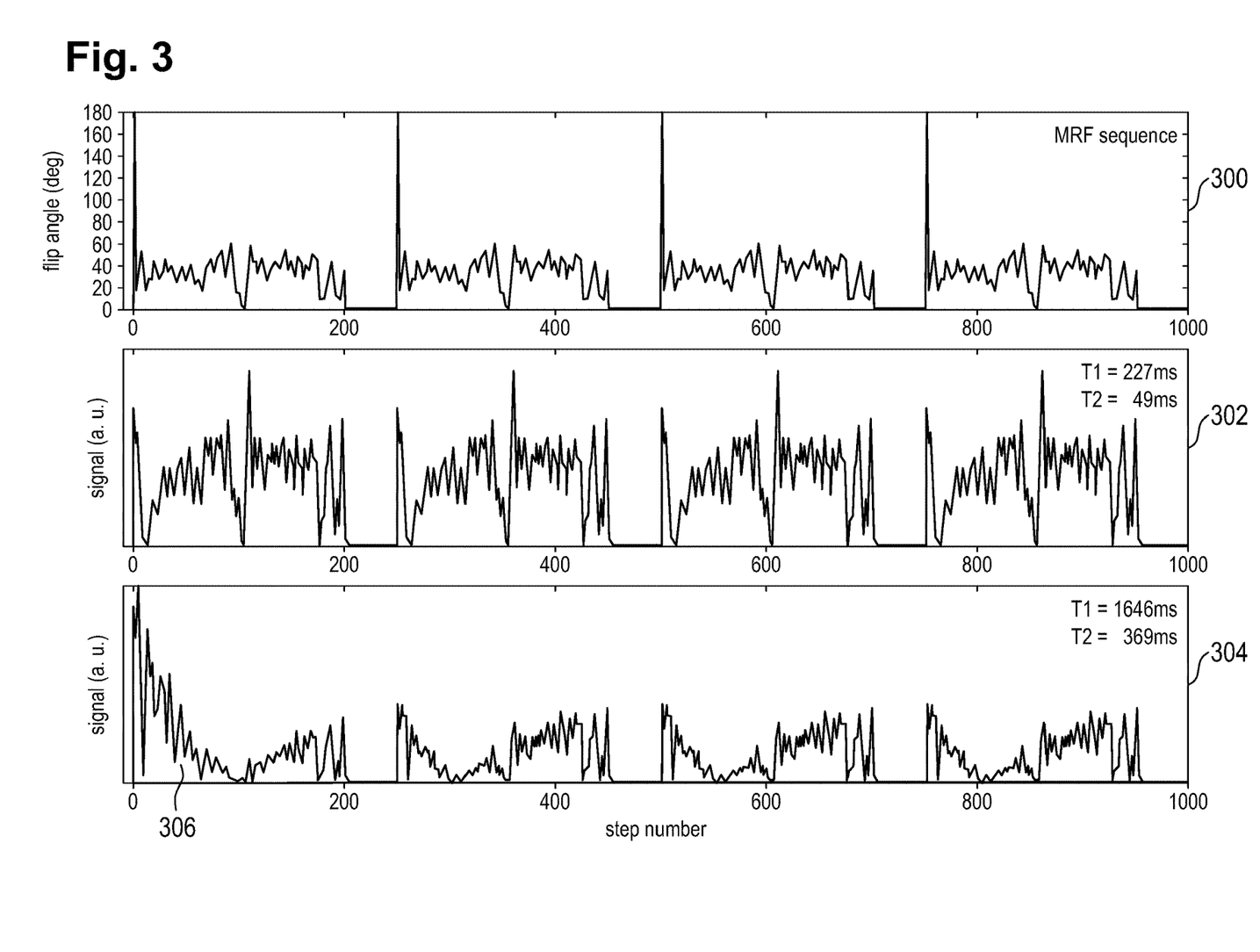
FIG. 3 illustrates the concept of a magnetic resonance signal reaching a steady state.

FIG. 3 is used to demonstrate the concept of a magnetic resonance signal reaching a steady state. There are three graphs present. Graph 300 shows four radio-frequency pulses used in a magnetic resonance fingerprinting sequence. Below in graphs 302 and 304 are shown the measured magnetic resonance signal in response to the RF-pulses of graph 300. In graph 302 the T1 relaxation time and the T2 relaxation time are short in comparison to the overall length of each of the RF-pulses in graph 300. It can be seen that there are only minor differences between the measured signals in graph 302. Below in graph 304 the T1 time is long in comparison to the RF-pulses in graph 300. It can be seen that the first MR signal 306 is radically different than the subsequent magnetic resonance signals. It can be seen that if the first MR signal 306 is dropped or is fit to a different magnetic resonance fingerprinting dictionary, then the subsequent magnetic resonance signals that are measured may be fit to a steady state magnetic resonance fingerprinting dictionary.

Figure 4:
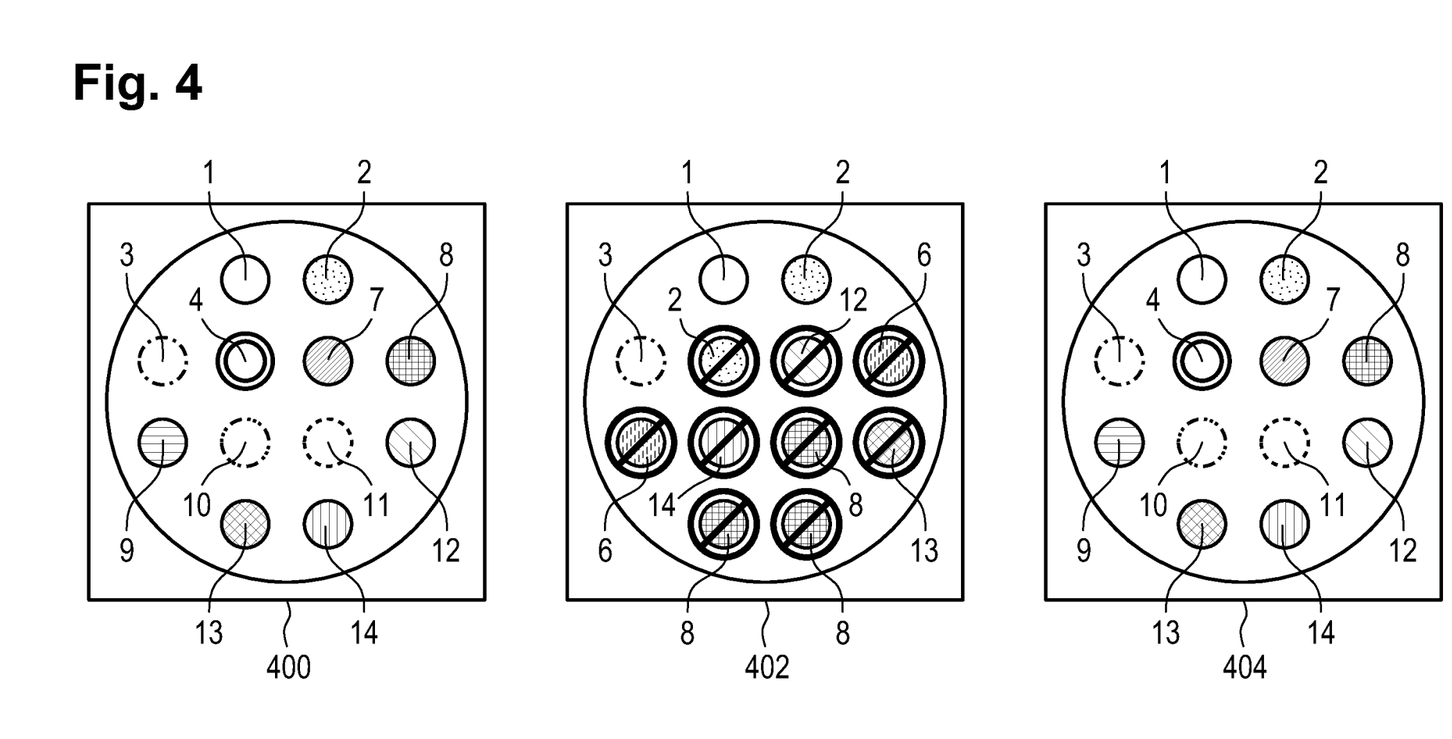
FIG. 4 shows three magnetic resonance fingerprinting images of a phantom with multiple known samples.

FIG. 4 shows three magnetic resonance fingerprinting images 400, 402, 404 of a phantom with multiple known samples. For these three images a phantom equipped with known gel samples is compared to a magnetic resonance fingerprinting dictionary with 18 different entries. In this example the phantom contains 12 of the 18 different samples. When acquiring the magnetic resonance data for image 400 there was a delay of 5 seconds between each of the radio-frequency pulses in the RF-pulse train. In image 400 each of the 12 samples was identified correctly. In image 402 the delay between each of the RF-pulses was only 0.5 seconds. In comparing the samples identified in 402 to 404 it can be seen that only three of the samples labeled 1, 2 and 3 in the upper left of image 402 are identified correctly. The other samples are identified incorrectly and are marked with a diagonal line through it to indicate that it is incorrect.

In image 404 the steady state magnetic resonance fingerprinting dictionary was used and it can be seen that all of the samples are identified identically with how they are identified in image 400. In image 404 the delay was also only 0.5 seconds. The acquisition of image 400 took 8 minutes and 33 seconds, and the acquisition of image 404 took only 3 minutes and 45 seconds. This illustrates how the use of a steady state magnetic resonance fingerprinting dictionary can be used to radically accelerate the acquisition of the magnetic resonance data for magnetic resonance fingerprinting protocols.

When the delay between the repetitions is short, the spin system will not have relaxed completely before the next inversion pulse. While the signal responses of the short-T1 system (FIG. 3, image 302) are almost identical for each repetition, the long-T1 system (FIG. 3, image 304) exhibits different signal responses. However, after three repetitions, even this system reaches a stationary fingerprint. In the first measurement, the delay between the MRF sequence repetitions is large (5 s), so that a fully relaxed spin system can be assumed each time. Using a dictionary calculated with this assumption, all 12 sample numbers are matched correctly (FIG. 4, image 400). When the delay is reduced to 0.5 s, the same dictionary leads to wrong matches because the assumption of a relaxed spin system is not valid any more (FIG. 4, image 402). When calculating a train of three sequence repetitions and using the steady-state fingerprint signal for the dictionary, all samples are matched correctly again (FIG. 4, 404). The first measurement took 8:33 min, the second one only 3:45 min.

In another example, the first acquisitions are performed in the least significant parts of k-space, so that the initial (transient) MRF signals do not distort the resulting images very much.

In another example, a few "dummy" repetitions of the MRF sequence are applied to the system before the acquisition of data starts. In this way, the system is already in the steady-state at the time of the first acquisition.

In another example, the number of repetitions to use for the calculation is dynamically adapted to the T1 and T2 values of the individual dictionary entries to be determined. The number of repetitions is chosen such that the system has reached the steady state in the last repetition. Since systems with smaller relaxation constants approach the steady state earlier, some computational time can be saved here.

In a further example radial sampling with a couple of spokes or spiral sampling with a number of interleaves is performed in a receptive manner with inter-train delays td=0.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 1 gel sample 1
2 gel sample 2
3 gel sample 3
4 gel sample 4
6 gel sample 6
7 gel sample 7
8 gel sample 8
9 gel sample 9
10 gel sample 10
11 gel sample 11
12 gel sample 12
13 gel sample 13
14 gel sample 14
100 magnetic resonance imaging system
104 magnet
106 bore of magnet
108 measurement zone or imaging zone
110 magnetic field gradient coils
112 magnetic field gradient coil power supply
114 radio-frequency coil
116 transceiver
118 subject
120 subject support
122 actuator
124 predetermined direction
125 slices
126 computer system
128 hardware interface
130 processor
132 user interface
134 computer storage
136 computer memory
140 pulse sequence commands
142 magnetic resonance data
144 steady state magnetic resonance fingerprinting dictionary
148 magnetic resonance image
150 control instructions
152 magnetic resonance fingerprint dictionary generating instructions
154 image reconstruction instructions
200 acquiring the multiple k-space traces of magnetic resonance data sequentially by controlling the magnetic resonance imaging system with pulse sequence commands
202 calculating the abundance of each of a set of predetermined substances for k-space traces that are acquired after a predetermined number of k-space traces of the multiple k-space traces has been acquired
300 RF pulse
302 MR signals
304 MR signals
306 first MR signal

The invention claimed is:

1. A magnetic resonance imaging system for acquiring magnetic resonance data from a subject within a measurement zone, wherein the magnetic resonance imaging system comprises:

a processor configured to control the magnetic resonance imaging system;

a memory configured to store machine executable instructions and pulse sequence commands, wherein the pulse sequence commands for controlling the magnetic resonance imaging system to acquire the magnetic resonance data according to a magnetic resonance fingerprinting protocol, wherein the pulse sequence commands are configured for controlling the magnetic resonance imaging system to generate an RF pulse train, wherein the pulse sequence commands are configured for controlling the magnetic resonance imaging system to acquire the magnetic resonance data as multiple k-space traces, wherein the pulse sequence commands are configured for controlling the RF pulse train to be repeated for the acquisition of each of the multiple k-space traces, wherein the machine executable instructions causes the processor to:
sequentially acquire the multiple k-space traces of magnetic resonance data by controlling the magnetic resonance imaging system with pulse sequence commands,
compare the k-space traces to a steady state magnetic resonance fingerprinting dictionary only after an initially acquired predetermined number of k-space traces has been performed and after the predetermined number of k-space traces has been acquired the magnetization has reached equilibrium in a steady state,
calculate the abundance of each of a set of predetermined substances for k-space traces that are acquired after a predetermined number of k-space traces of the multiple k-space traces has been acquired, wherein the abundance of each of a set of predetermined substances is determined by comparing the magnetic resonance data with the steady state magnetic resonance fingerprinting dictionary, wherein the steady state magnetic resonance fingerprinting dictionary contains a listing of calculated magnetic resonance signals in response to the RF pulse train for a set of predetermined substances, and
dynamically adapt the predetermined number of k-space traces is to the $T_1$ and $T_2$ values of the individual dictionary entries to be determined.

2. The magnetic resonance imaging system of claim 1, wherein execution of the machine executable instructions cause the processor to discard the predetermined number of k-space traces.

3. The magnetic resonance imaging system of claim 1, wherein the pulse sequence commands are configured for controlling the magnetic resonance imaging system to repeat the RF pulse train with a maximum delay between each RF pulse train, wherein the maximum delay is any one of the following: less than 5 seconds, less than 1 second, less than 0.5 seconds, less than 0.1 seconds, less than 0.05 seconds, and less than 0.00 seconds.

4. The magnetic resonance imaging system of claim 1, wherein the magnetic resonance imaging system comprises a magnet with a main magnetic field, wherein the main magnetic field has an average magnetic field magnitude within the measurement zone, wherein execution of the machine executable instructions causes the processor to repeat each RF pulse train faster than any one of the following: 5 times a maximum $T_1$ time of the set of predetermined substances in the average magnetic field magnitude, 1 times a maximum $T_1$ time of the set of predetermined substances in the average magnetic field magnitude, 0.5 times a maximum $T_1$ time of the set of predetermined substances in the average magnetic field magnitude, and 0.1 times a maximum $T_1$ time of the set of predetermined substances in the average magnetic field magnitude.

5. The magnetic resonance imaging system of claim 1, wherein execution of the machine executable instructions further causes the processor to calculate the steady state magnetic resonance fingerprinting dictionary.

6. The magnetic resonance imaging system of claim 5, wherein execution of the machine executable instructions further causes the processor to calculate the steady state magnetic resonance fingerprinting dictionary by modeling repeated application of the RF pulse train to each of the set of predetermined substances.

7. The magnetic resonance imaging system of claim 6, wherein execution of the machine executable instructions further causes the processor to determine the predetermined number during calculation of the steady state magnetic resonance fingerprinting dictionary, wherein the predetermined number is determined using a convergence criteria to determine convergence of simulated magnetic resonance data generated during the calculation of the steady state magnetic resonance fingerprinting dictionary.

8. The magnetic resonance imaging system of claim 1, wherein the pulse sequence commands are configured for controlling the magnetic resonance imaging system to perform any one of the following: rotate the multiple k-space traces in k-space, acquire the multiple k-space traces using radial sampling, acquire the multiple k-space traces using Cartesian sampling, and acquire the multiple k-space traces using non-Cartesian sampling.

9. The magnetic resonance imaging system of claim 1, wherein the pulse sequence commands are configured for controlling the magnetic resonance imaging system to acquire the magnetic resonance data according to a PROPELLER magnetic resonance imaging protocol.

10. The magnetic resonance imaging system of claim 1, wherein the pulse sequence commands are configured for controlling the magnetic resonance imaging system to acquire the multiple k-space traces as spirals in k-space.

11. The magnetic resonance imaging system of claim 1, wherein the pulse sequence commands are configured for controlling the magnetic resonance imaging system to acquire the multiple k-space traces as lines in Cartesian k-space.

12. The magnetic resonance imaging system of claim 11, wherein the pulse sequence commands are configured for controlling the magnetic resonance imaging system to acquire the magnetic resonance data according to any one of the following: a parallel imaging magnetic resonance imaging protocol, a SENSE magnetic resonance imaging protocol, and a GRAPPA magnetic resonance imaging protocol.

13. A computer program product comprising machine executable instructions for execution by a processor controlling a magnetic resonance imaging system to acquire magnetic resonance data from a subject within a measurement zone, wherein the machine executable instructions causes the processor to:
sequentially acquire multiple k-space traces of magnetic resonance data by controlling the magnetic resonance imaging system with pulse sequence commands for controlling the magnetic resonance imaging system to acquire the magnetic resonance data according to a magnetic resonance fingerprinting protocol, wherein the pulse sequence commands are configured for controlling the magnetic resonance imaging system to generate an RF pulse train, wherein the pulse sequence commands are configured for controlling the magnetic resonance imaging system to acquire the magnetic resonance data as multiple k-space traces, wherein the pulse sequence commands are configured for controlling the RF pulse train to be repeated for the acquisition of each of the multiple k-space traces;
comparing only the k-space traces acquired after the magnetization has reached an equilibrium state to a steady state magnetic resonance fingerprinting dictionary; and calculating the abundance of each of a set of predetermined substances for k-space traces that are acquired after a predetermined number of k-space traces of the multiple k-space traces has been acquired, wherein the abundance of each of a set of predetermined substances is determined by comparing the magnetic resonance data with the steady state magnetic resonance fingerprinting dictionary, wherein the steady state magnetic resonance fingerprinting dictionary contains a listing of calculated magnetic resonance signals in response to the RF pulse train for a set of predetermined substances; and dynamically adapting the predetermined number of k-space traces acquired before the magnetization has reached the equilibrium state to $T_1$ and $T_2$ values of individual entries of the steady state magnetic resonance fingerprinting dictionary to be determined.

14. A method of operating a magnetic resonance imaging system for acquiring magnetic resonance data from a subject within a measurement zone, wherein the method comprises:

sequentially acquiring multiple k-space traces of the magnetic resonance data by controlling the magnetic resonance imaging system with pulse sequence commands for controlling the magnetic resonance imaging system to acquire the magnetic resonance data according to a magnetic resonance fingerprinting protocol, wherein the pulse sequence commands are configured for controlling the magnetic resonance imaging system to generate an RF pulse train, wherein the pulse sequence commands are configured for controlling the magnetic resonance imaging system to acquire the multiple k-space traces, wherein the pulse sequence commands are configured for controlling the RF pulse train to be repeated for the acquisition of each of the multiple k-space traces;

calculating the abundance of each of a set of predetermined substances for k-space traces that are acquired after a predetermined number of k-space traces of the multiple k-space traces has been acquired, wherein the abundance of each of a set of predetermined substances is determined by comparing k-space traces acquired after the magnetization has reached a steady state equilibrium with a steady state magnetic resonance fingerprinting dictionary, wherein the steady state magnetic resonance fingerprinting dictionary contains a listing of calculated magnetic resonance signals in response to the RF pulse train for a set of predetermined substances; and dynamically adapting the number of k-space traces acquired before the k-space traces that are compared to the steady state magnetic resonance fingerprinting dictionary to $T_1$ and $T_2$ values of individual steady state magnetic resonance fingerprinting dictionary entries to be determined.

15. The method of claim 14, wherein the number of k-space traces acquired before the magnetization has reach equilibrium is preselected based on the $T_1$ and $T_2$ values of the individual steady state magnetic resonance fingerprinting dictionary entries to be determined.

16. A computer processor configured to perform the method of claim 14.

* * * * *